United States Patent
Nakao

[11] Patent Number: 5,958,656
[45] Date of Patent: Sep. 28, 1999

[54] PATTERN FORMING METHOD USING PHASE SHIFT MASK

[75] Inventor: Shuji Nakao, Hyogo, Japan

[73] Assignee: Mitsubishi Denki Kabushiki Kaisha, Tokyo, Japan

[21] Appl. No.: 08/767,498

[22] Filed: Dec. 16, 1996

[30] Foreign Application Priority Data

Jun. 20, 1996 [JP] Japan .................................. 8-181300

[51] Int. Cl.⁶ ...................................................... G03F 7/20
[52] U.S. Cl. ........................................... 430/394; 430/396
[58] Field of Search ...................................... 430/311, 312, 430/322, 394, 396

[56] References Cited

FOREIGN PATENT DOCUMENTS

| 62-45026 | 2/1987 | Japan | 430/394 |
| 1-107527 | 4/1989 | Japan | 430/394 |
| 4-186244 | 7/1992 | Japan . | |
| 5-197126 | 8/1993 | Japan . | |
| 5-198479 | 8/1993 | Japan . | |

*Primary Examiner*—Kathleen Duda
*Attorney, Agent, or Firm*—McDermott, Will & Emery

[57] ABSTRACT

A prescribed region of a photoresist is subjected to first exposure, second exposure, and thereafter to development. Different phase shift masks are used at the time of the first exposure and the second exposure, respectively. Each phase shift mask has a light shielding film located between two light transmitting portions for respectively transmitting light with a phase difference of 180°. Thus, a pattern forming method using a phase shift mask, which allows formation of small hole patterns even with the exposure light being slightly defocused in the case of forming hole dense patterns such as those in a memory device, can be provided.

5 Claims, 21 Drawing Sheets

ΔF = -1.2 μm

ΔF = -0.8 μm

ΔF = 0μm

ΔF = +0.8μm

ΔF = +1.2 um

ELECTRIC
FIELD
OVER MASK

LIGHT
INTENSITY
AT WAFER

ELECTRIC
FIELD
OVER MASK

LIGHT
INTENSITY
AT WAFER

ELECTRIC
FIELD
OVER MASK

LIGHT
INTENSITY
AT WAFER

PATTERN FORMING METHOD USING PHASE SHIFT MASK

BACKGROUND OF THE INVENTION

1. Field of the Invention

The present invention relates to a pattern forming method using a phase shift mask, and more particularly, to a pattern forming method of carrying out double exposure of a single photoresist using a phase shift mask.

2. Description of the Background Art

Significant improvement in both integration degree and miniaturization of semiconductor integrated circuits have been made in recent years. With such improvement, reduction in size of circuit patterns formed on semiconductor substrates (hereinafter simply refereed to as wafers) have been rapidly achieved.

Particularly, the photolithography technique has been widely recognized as a basic technique of pattern formation. Therefore, various development and improvement of the photolithography technique has been made. However, patterns become increasingly smaller, and the need for improvement in resolution of patterns has been increased.

This photolithography technique is a technique of transferring patterns of a mask (an original picture) onto a photoresist applied on a wafer and patterning a lower film to be etched using the pattern-transferred photoresist. The photoresist is subjected to development after patterns are transferred thereto. A photoresist of a type in which a portion exposed to light is removed by development is called a positive photoresist, while that of a type in which a portion not exposed to light is removed is called a negative photoresist.

Generally, the resolution limit R (nm) in the photolithography technique using the reduction type projection printing is given by the following equation:

$$R = k_1 \cdot \lambda / (NA)$$

where $\lambda$ is a wavelength (nm) of light for use, NA is numerical aperture of a lens, and $k_1$ is a constant depending on a resist process.

As can be seen from the above equation, in order to improve the resolution limit R, that is, to obtain small patterns, it is possible to reduce values of $k_1$ and $\lambda$ and increase a value of NA. More specifically, it is possible to reduce both a constant depending on a resist process and a wavelength and to increase NA.

However, improvement in light sources and lenses is technically difficult, and both reduction in wavelength and increase in NA causes reduction in the depth of focus $\delta(\delta = k_2 \cdot \lambda / (NA)^2)$, resulting in degradation of the resolution.

Then, shrinking of patterns by improvement of photomasks instead of both light sources and lenses has been studied. In recent years, phase shift masks have attracted attention as photomasks of a super-resolution technique for improvement in the resolution of the patterns. The structure and principle of the phase shift masks will now be described in comparison with the ordinary photomasks. The phase shift masks of Levenson and halftone types will be described.

FIGS. 24A, 24B and 24C are diagrams respectively showing a cross section of a mask, an electric field over the mask and a light intensity at a wafer in the case of an ordinary photomask. Referring to FIG. 24A, the ordinary photomask is structured such that a metal mask pattern 103 is formed on a glass substrate 101. An electric field over such a photomask is spatially pulse-modulated by metal mask pattern 103 as shown in FIG. 24B.

Referring to FIG. 24C, however, with shrinking of patterns, exposure light passing through the photomask also reaches around an unexposed region (a region which is shielded from exposure light by metal mask pattern 103) on a wafer due to optical diffraction. Therefore, the unexposed region on the wafer is also irradiated with exposure light, causing reduction in a light contrast (the difference in light intensity between exposed and unexposed regions on the wafer). As a result, the resolution is degraded, making it difficult to carry out transfer of small patterns.

FIGS. 25A, 25B and 25C are diagrams respectively showing a cross section of a mask, an electric field over the mask and a light intensity at a wafer in the case of a phase shift mask of Levenson type. Referring first to FIG. 25A, the phase shift mask includes an optical member 105 called a phase shifter in addition to the components of the ordinary photomask.

More specifically, a chromium mask pattern 103 is formed on a glass substrate 101 so that light transmitting regions and light shielding regions are provided, and phase shifter 105 is provided every other light transmitting region. This phase shifter 105 serves to change a phase of light passing therethrough by 180°.

Referring to FIG. 25B, since phase shifter 105 is provided in every other light transmitting region as described above, such an electric field is formed over the mask that light passing through the light transmitting regions of the phase shift mask is alternately reversed in phase by 180°. Thus, since light at adjacent exposed regions is opposite in phase, light will cancel each other in the overlapping region of exposure light being opposite in phase, by optical interference.

As a result, as shown in FIG. 25C, a light intensity is reduced at the portion between exposed regions on the wafer, whereby sufficient difference in light intensity between exposed and unexposed regions on the wafer can be achieved. Thus, the resolution can be improved and transfer of fine patterns can be realized.

FIGS. 26A, 26B and 26C are diagrams respectively showing a cross section of a mask, an electric field over the mask and a light intensity at a wafer in the case of a phase shift mask of halftone type. Referring first to FIG. 26A, the phase shift mask of halftone type also includes an optical member 106 called a phase shifter as in the case of that of Levenson type described above.

However, optical member 106 is formed only on a semi-transparent film 103 on a glass substrate 101 so that a two-layer structure consisting of phase shifter 106 and semitransparent film 103 is provided. This phase shifter 106 serves to change a phase of light passing therethrough by 180° as in the case of the above described phase shift mask of Levenson type, and semitransparent film 103 serves to attenuate an intensity of exposure light without completely blocking the exposure light.

Referring to FIG. 26B, since the two-layer structure consisting of phase shifter 106 and semitransparent film 103 is provided as described above, such an electric field is formed over the mask that light passing through a semi transparent region and a light transmitting region of the phase shift mask is alternately reversed in phase by 180°, wherein a light intensity at one phase is lower than that at the other phase. More specifically, light is reversed in phase by 180° as a result of passing through phase shifter 106, and is attenuated in intensity as a result of passing through semi-transparent film 103 so that a photoresist with a prescribed thickness is left after development. Since light at adjacent exposed regions is opposite in phase, light cancels each other in the overlapping region of exposure light being opposite in phase.

As a result, as shown in FIG. 26C, a phase is reversed at an edge of a pattern, so that a light intensity can be reduced at the edge of the pattern. Consequently, the difference in intensity between exposure light passing through semitransparent film 103 and exposure light not passing therethrough is increased, and resolution of a pattern image can be improved.

The phase sift masks for the super-resolution technique are of various types such as Levenson and halftone types. Effective methods for formation of hole-shaped patterns in the super-resolution technique includes exposure using the above described phase shift mask of halftone type, and exposure using a phase shift mask of auxiliary pattern type. However, the effects obtained by these exposures are not sufficient, and it has been considered that formation of holes having an opening diameter of 200 nm is a practical limit in the case of exposure by KrF light with a wavelength of 248 nm, for example.

On the other hand, an opening diameter of holes required for devices has been already in the range from 150 to 100 nm, and formation of such small holes has been carried out by a diameter reducing technique using film formation, etching and the like. However, this technique requires a number of steps such as film formation and etching, causing significant increase in manufacturing cost of devices.

A countermeasure of the above problem is disclosed by Japanese Patent Laying-Open No. 5-197126. The method therein will now be described as a conventional pattern forming method using a phase shift mask.

FIG. 27 is a plan view schematically showing a structure of a phase shift mask for use in the conventional pattern forming method, and FIG. 28 is a schematic cross section taken along the line G–G' in FIG. 27. Referring to FIGS. 27 and 28, a phase shift mask 210 is structured such that only phase shifters 203a and 203b are formed on a quartz substrate 201. A surface of quartz substrate 210 is equally divided into first and second regions 201a and 201b. A plurality of phase shifters 203a extending in parallel in the longitudinal direction (the direction Y in the figure) are provided in first region 201a, and a plurality of phase shifters 203b extending in parallel in the direction (the direction X in the figure) perpendicular to the longitudinal direction are provided in second region 201b.

As exposure, double exposure of a resist is carried out using the above described phase shift mask 210. More specifically, as shown in FIG. 29, a photoresist 211 is first subjected to first exposure. Thereafter, photoresist 211 is subjected to second exposure with phase shift mask 210 being moved such that second region 201b in the first exposure overlap first region 201a in the second exposure. Thus, exposure light is directed to photoresist 211 such that phase shifter 203b of second region 201b in the first exposure intersects phase shifter 203a of first region 201a in the second exposure.

In the exposure using phase shift mask 210, fine dark lines (regions with the lowest light intensity) are formed in the portions of photoresist 211 corresponding to shifter edge portions 203c and 203d of phase shifters 203a and 203b, as shown in FIG. 30. Therefore, if double exposure is carried out such that the fine dark lines intersect each other, small dark points are formed in intersections 207 of the fine dark lines.

If negative photoresist 211 is brought into a photosensitive state in the above described manner, hole patterns with a small diameter is formed at small dark points 207.

In the technology described in the above document, exposure with an i-line (a wavelength of 365 nm) makes it possible to form holes with an opening diameter of 200 nm.

In the conventional pattern forming method, however, a phase shift mask having no light shielding film is used. Therefore, hole patterns with a small diameter can be formed only when the distance between fine dark lines is large enough, that is, when the lines are isolated from each other. More specifically, for phase shift mask 210 shown in FIGS. 27 and 28, the distance $L_1$ or $L_2$ between light transmitting regions needs to be equal to or more than a so-called coherence length (up to 1.0 μm for i-line and up to 0.7 μm for KrF light). Therefore, the distance between hole patterns formed in the photoresist is necessarily increased, so that dense holes (holes with a small distance therebetween) for memory devices or the like such as DRAMs (Dynamic Random Access Memories) cannot be formed.

In order to make sure of the foregoing, we carried out the following simulation using a phase shift mask having no light shielding film.

First, a one-dimensional mask (i.e. a mask with a line shaped pattern) in which a phase shifter 303 extending straight on a transparent substrate 301 was formed as shown in FIGS. 31 and 32 was used as phase shift mask. Note that FIG. 32 is a schematic cross sectional view taken along the line H–H' of FIG. 31.

Exposure was carried out with focus offsets ΔF of 0 μm and 1.0 μm for both dense patterns with a distance of 0.5 μm between shifter edges of the phase shift mask (that is, the distances $L_3$ and $L_4$ are 0.5 μm each) and sparse patterns with a distance of 2.0 μm therebetween (that is, the distances $L_3$ and $L_4$ are 2.0 μm each) to measure a light intensity at a wafer. The exposure was carried out with numerical aperture NA of 0.45 and coherency σ of 0.50.

As a result, when exposure light was focused with a focus offset ΔF of 0 μm, a light contrast was large enough to produce sufficiently dark lines for both the above-mentioned distances of 0.5 μm and 2.0 μm as shown in FIGS. 33 and 34, respectively. More specifically, a light intensity at a shifter formation region was sufficiently lager than that at a shifter edge portion (a portion around 0.4 μm in the figure).

Furthermore, even when exposure light was defocused with a focus offset ΔF of 1.0 μm, a light contrast was large enough to produce sufficiently dark lines for the above-mentioned distance of 2.0 μm, as shown in FIG. 35.

For the above-mentioned distance of 0.5 μm, however, a light contrast was reduced so much with a focus offset ΔF of 1.0 μm that the resultant image was not sharp enough, as shown in FIG. 36.

It is herein assumed that a pattern shape of a resist is determined by a slice level S (shown by a dotted line) in the figures. Then, in the case of the sparse patterns with exposure light being focused with a focus offset ΔF of 1.0 μm, since there is a region having a light intensity lower than the slice level S as shown in FIG. 35, patterns are formed in the resist. In the case of the dense patterns with a distance of 0.5 μm therebetween, however, when exposure light is defocused with a focus offset ΔF of 1.0 μm, there is no region having a light intensity lower than the slice level S as shown in FIG. 36, so that patterns cannot be formed in the resist.

Note that the slice level S herein indicates a value of a light intensity used as a reference of determination whether a resist is removed or not by development (or whether a resist is left or not by development). More specifically, a region exposed to light having a light intensity equal to or higher than the slice level S is removed by development in the case of a positive resist, while is left by development in the case of a negative resist.

It can be seen from the result of the above simulation that, for the phase shift mask having no light shielding film, sufficient depth of focus DOF cannot be assured in the case of dense hole patterns such as those with a distance of 0.5 μm therebetween and small hole patterns cannot be formed with exposure light being even slightly defocused.

SUMMARY OF THE INVENTION

It is an object of the present invention to provide a pattern forming method using a phase shift mask allowing formation of small hole patterns even with exposure light being slightly defocused in the case of dense patterns such as those in memory devices.

In a pattern forming method using a phase shift mask according to the present invention, a prescribed region of a photoresist applied to a wafer is first subjected to first exposure using a first phase shift mask, and thereafter to second exposure using a second phase shift mask. The first phase shift mask includes a substrate having first and second light transmitting portions extending in parallel in a first direction for respectively transmitting exposure light with a phase difference therebetween, and a light shielding film located between the first and second light transmitting portions extending in parallel. The second phase shift mask includes a substrate having third and fourth light transmitting portions extending in parallel in a second direction for respectively transmitting exposure light with a phase difference therebetween, and a light shielding film located between the third and fourth light transmitting portions extending in parallel. The first exposure and the second exposure are carried out such that the first direction of the first phase shift mask for use in the first exposure intersects the second direction of the second phase shift mask for use in the second exposure.

The photoresist is a negative resist. Hole patterns are formed, by development of the photoresist, in a region of a surface of the photoresist which corresponds to a region where the light shielding film of the first phase shift mask and the light shielding film of the second phase shift mask intersect each other.

In the pattern forming method using a phase shift mask according to the present invention, since double exposure is carried out such that respective patterns of the first and second phase shift masks intersect each other, hole patterns having a small opening diameter can be formed.

Furthermore, a light shielding film is located between the first and second light transmitting portions for respectively transmitting exposure light with opposite phases. Therefore, small holes can be formed in the case of dense patterns even if exposure light is slightly defocused.

According to one preferred aspect of the present invention, coherency σ of exposure light for use in the first and second exposure is in the range from 0.1 to 0.3.

When coherency σ is larger than 0.3, a degree of interference of light having opposite phases becomes so small that the effect of a phase shift mask to improve resolution by interference of light having opposite phases cannot be obtained effectively. Furthermore, when coherency σ is smaller than 0.1, a degree of interference of light having opposite phases becomes so large that a pattern with an undesired shape is likely to be produced in a region where the regularity of pattern arrangement is degraded.

According to another preferred aspect of the present invention, third exposure in which a periphery of a region where first and second directions intersect each other within a prescribed region of the photoresist is irradiated with exposure light is further carried out after the second exposure.

The exposure using a phase shift mask is a technique for improving resolution by interference of light having opposite phases. Therefore, in forming regularly arranged patterns, regular interference of exposure light is achieved, and therefore patterns with a uniform shape can be formed. In a region where the regularity of pattern arrangement is degraded, however, the regularity of interference of exposure light is also degraded, making it difficult to form patterns with a uniform shape.

Accordingly, in the third exposure, exposure light is directed to the periphery of the intersection region, where the regularity of pattern arrangement is degraded. Thus, patterns in the periphery are removed, so that only the patterns having a uniform shape can be left.

According to a further preferred aspect of the present invention, the third exposure is carried out with numerical aperture NA of at least 0.50 and coherency σ of exposure light of at least 0.60.

In the third exposure, exposure light must be directed only to the periphery where formation of patterns with a uniform shape is difficult. Therefore, an edge of an image to be transferred to a photoresist needs to be sharp, and interference of exposure light must be reduced as well as exposure light with a high spacial frequency must be used. Therefore, it is preferable that numerical aperture NA is at least 0.50 and coherency σ of exposure light is at least 0.60.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

First Embodiment

In a pattern forming method using a phase shift mask according to a first embodiment of the present invention, double exposure is used as in the case of the above mentioned conventional example. However, a phase shift mask for use in the double exposure of the present embodiment is different in structure from that of the conventional example.

Figure 1:
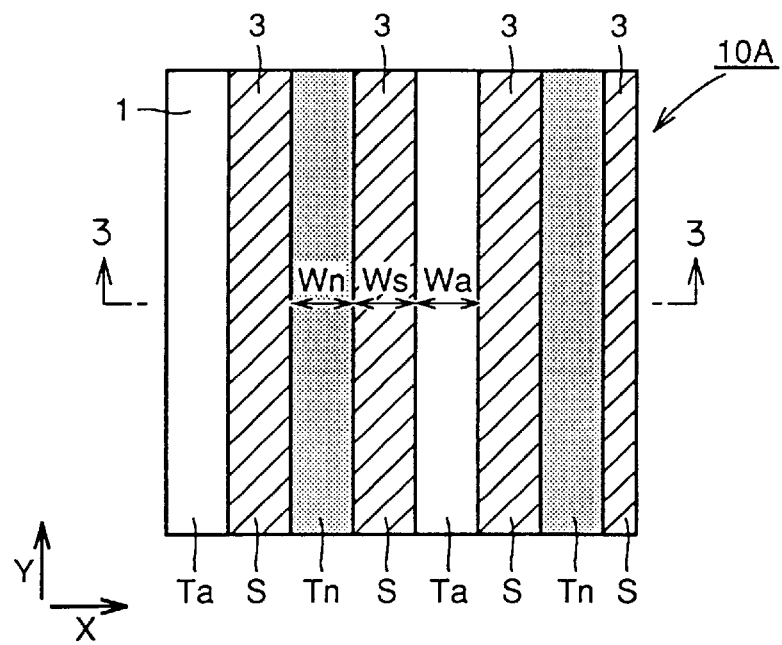
FIG. 1 is a plan view schematically showing a structure of a first phase shift mask for use in first exposure of double exposure in a pattern forming method using a phase shift mask according to a first embodiment of the present invention.
Figure 3:
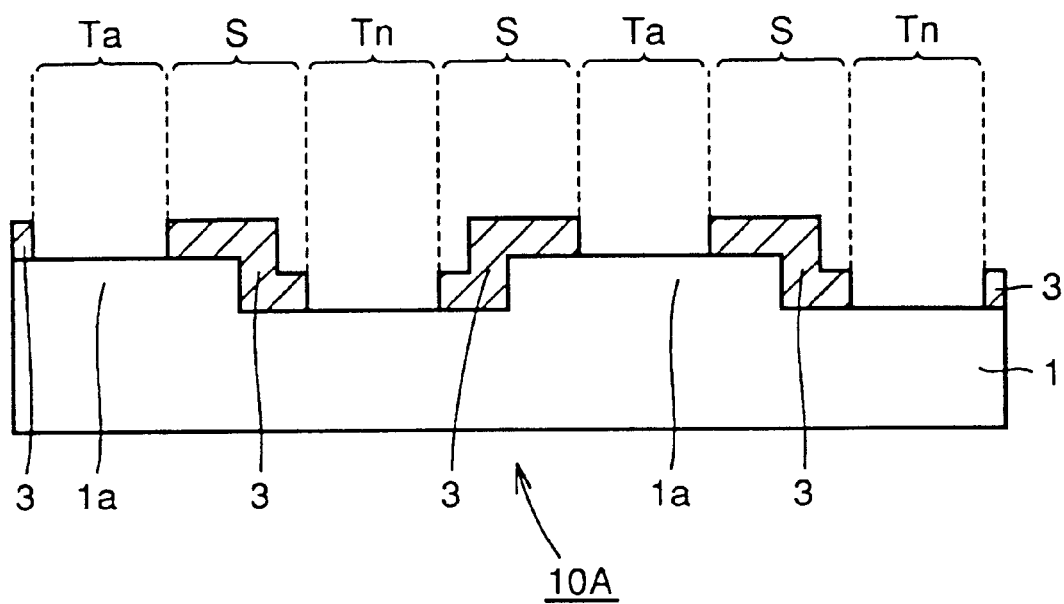
FIG. 3 is a schematic cross sectional view taken along the line A–A' of FIG. 1.

Referring mainly to FIGS. 1 and 3, a first phase shift mask 10A for use in first exposure of the double exposure is a phase shift mask of Levenson type, and has a transparent substrate 1 of quartz, for example, and a light shielding film 3 of chromium, for example.

First and second light transmitting portions Tn and Ta and a light shielding portion S are formed in first phase shift mask 10A. First and second light transmitting portions Tn and Ta transmit exposure light with a phase difference of 180°, and are located alternately with light shielding film 3 interposed therebetween. Each two-dimensional pattern of first and second light transmitting portions Tn and Ta and light shielding film 3 has a line-like shape extending almost straight in the direction Y in the figure. Respective line widths Wn and Wa of first and second light transmitting portions Tn and Ta are approximately the same, and a line width Ws of light shielding film 3 is limited.

Figure 2:
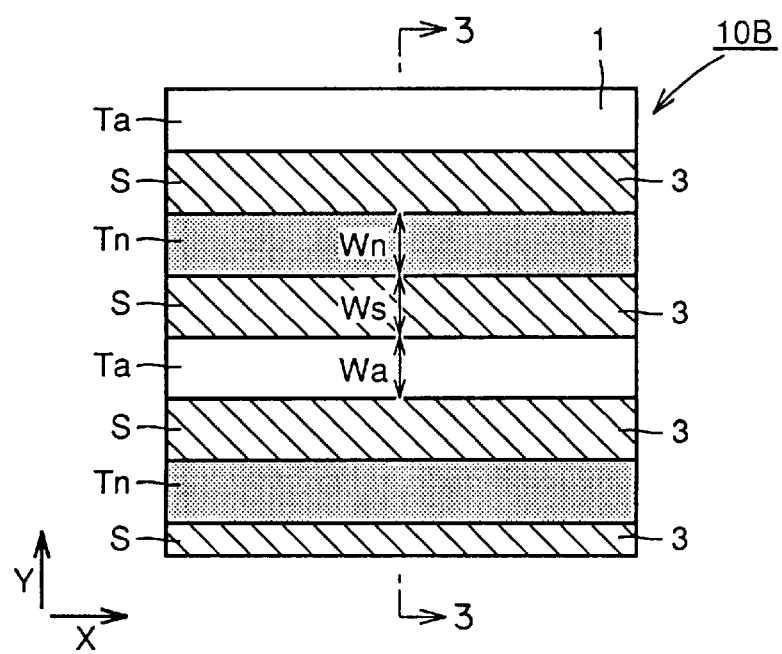
FIG. 2 is a plan view schematically showing a structure of a second phase shift mask for use in second exposure of the double exposure in the pattern forming method using a phase shift mask according to the first embodiment of the present invention.

Referring mainly to FIG. 2, a second phase shift mask 10B for use in second exposure of the double exposure has approximately the same structure as that of the above mentioned first phase shift mask 10A. Therefore, a cross-sectional structure of second phase shift 10B taken along the line B–B' corresponds to that shown in FIG. 3.

In second phase shift mask 10B, however, first and second light transmitting portions Tn and Ta and a light shielding film 3 are formed with a line-like shape extending almost straight in the direction X in the figure.

The pattern forming method using a phase shift mask according to the present embodiment will now be described.

Figure 4A:
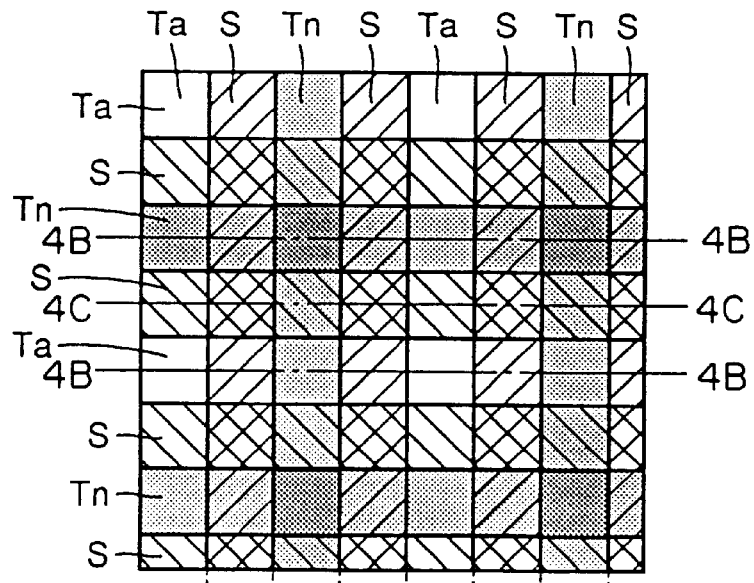
FIG. 4A is a plan view showing the first and second phase shift masks overlapping each other.
Figure 4B:
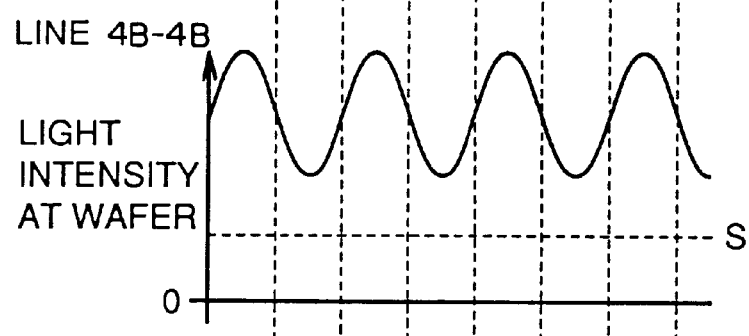
FIG. 4B is a diagram showing a light intensity at a wafer along the lines C—C and E—E of FIG. 4A.
Figure 4C:
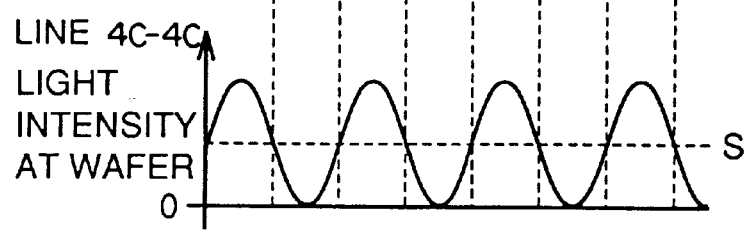
FIG. 4C is a diagram showing a light intensity at a wafer along the line D—D of FIG. 4A.

FIGS. 4A, 4B and 4C are diagrams used in illustration of the pattern forming method using a phase shift mask according to the first embodiment of the present invention.

Referring to FIG. 4A, an image of the first phase shift mask 10A (FIG. 1) is projected by the reduction type projection printing onto a prescribed region of a negative resist-applied semiconductor substrate being in the process of forming a semiconductor integrated circuit. Thereafter, an image of the second phase shift mask 10B (FIG. 2) is projected onto the prescribed region described above. At this time, exposure is carried out such that straight patterns of second phase shift mask 10B are located approximately perpendicular to those of first phase shift mask 10A.

Furthermore, each exposure of the double exposure is carried out with numerical aperture NA of 0.55 and coherency σ of 0.20, for example.

Referring to FIG. 4B, a light intensity at a region of a wafer corresponding to a region where light transmitting portions Tn and Ta of first and second phase shift masks 10A and 10B overlap with each other is higher than that at a region of the wafer corresponding to a region where light transmitting portions Tn and Ta of first and second phase shift masks 10A and 10B overlap with light shielding film 3 thereof.

Referring to FIG. 4C, a light intensity at a region of the wafer correponding to a region where light shielding films 3 of first and second phase shift masks 10A and 10B overlap with each other is lower than that at a region of the wafer corresponding to a region where light transmitting portions Tn an Ta of first and second phase shift masks 10A and 10B overlap with light shielding film 3 thereof. The light intensity at the region of the wafer corresponding to the region where light shielding films 3 overlap with each other is 0 or close to 0.

Figure 5:
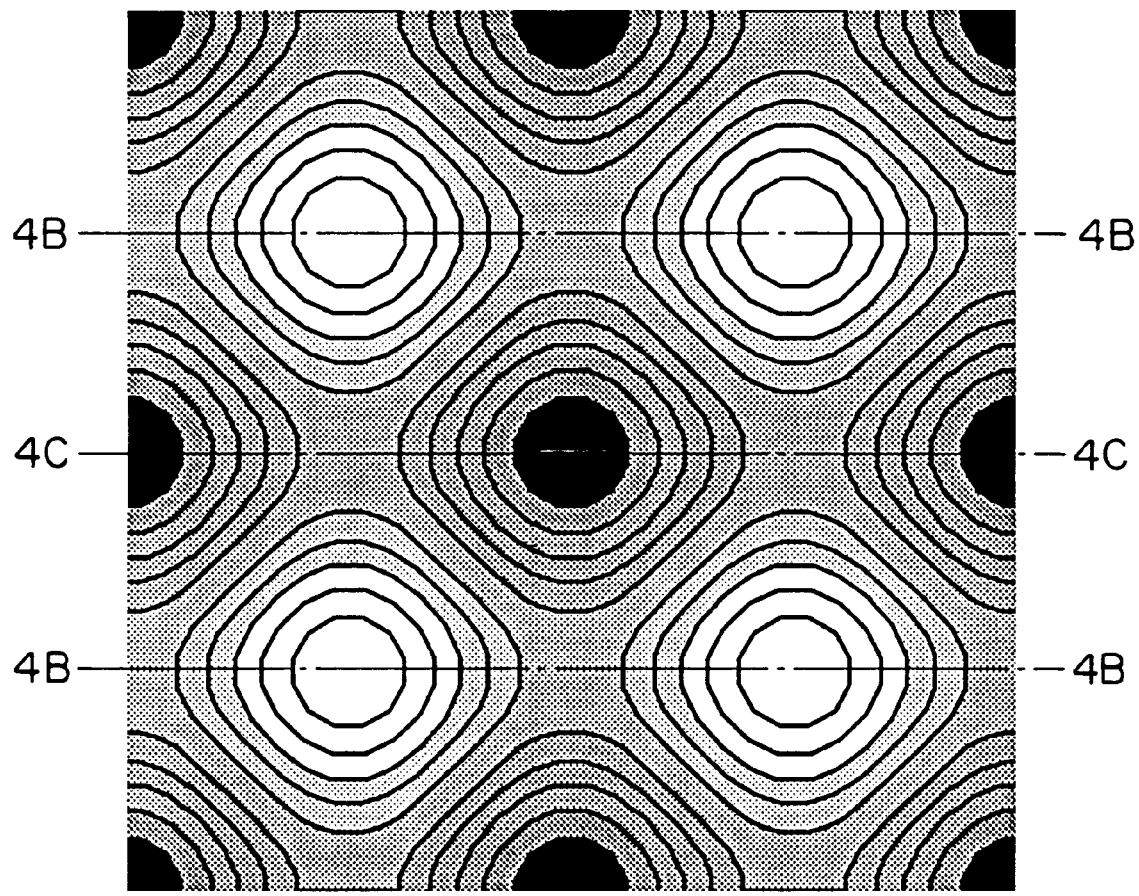
FIG. 5 is a diagram showing the distribution of a light intensity at a wafer after the double exposure in the pattern forming method using a phase shift mask according to the first embodiment of the present invention.

Thus, the two-dimensional distribution of a light intensity at a surface of the wafer which has been subjected to the double exposure is as shown in FIG. 5.

Referring to FIG. 5, a black portion in the figure indicates a region with a low light intensity, and a white portion indicates a region with a high light intensity. In addition, the lines C—C, D—D and E—E in FIG. 5 correspond to the lines C—C, D—D and E—E in FIG. 4A, respectively.

In the case of a negative resist, a dark portion (a black region in FIG. 5) of the photoresist is dissolved and removed by usual development after such exosure, so that hole patterns are formed.

The simulation we carried out to examine an optical image obtained by the double exposure of the present embodiment will now be described.

Figure 6:
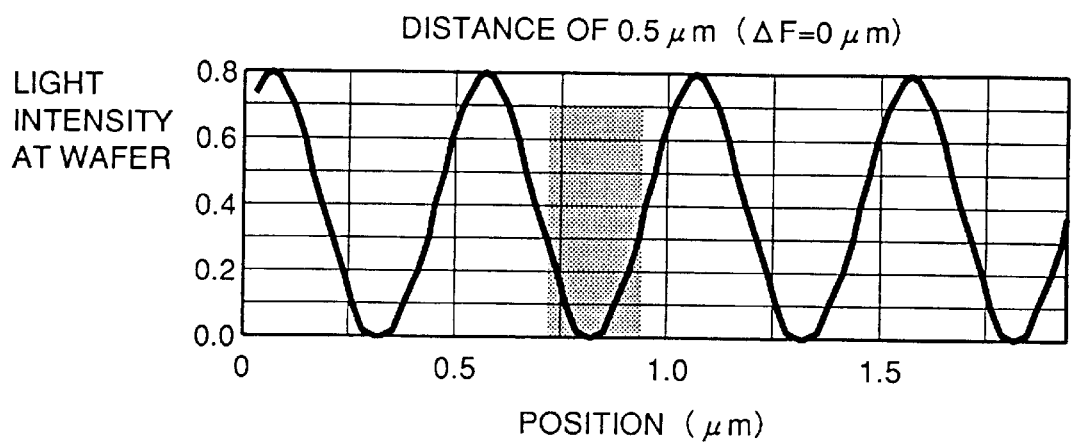
FIG. 6 is a first diagram showing a light intensity at a wafer in the case where a phase shift mask of the first embodiment of the present invention is used.
Figure 7:
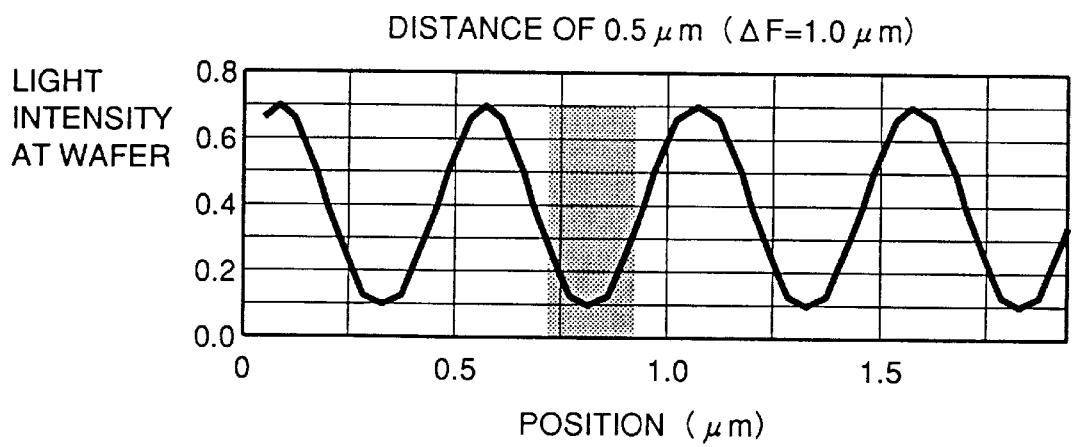
FIG. 7 is a second diagram showing a light intensity at a wafer in the case where the phase shift mask of the first embodiment of the present invention is used.

In this simulation, a phase shift mask of FIG. 1 having line widths Wn, Ws and Wa of 0.25 μm was used. In addition, exposure was carried out with numerical aperture NA of 0.55 and coherency σ of 0.20, and an optical image obtained with each of focus offsets ΔF of 0 μm (in focus) and 1.0 μm was examined. FIGS. 6 and 7 show optical images obtained by the simulation. Note that FIG. 6 shows an optical image obtained with a focus offset ΔF of 0 μm and FIG. 7 shows that with a focus offset ΔF of 1.0 μm.

Figure 36:
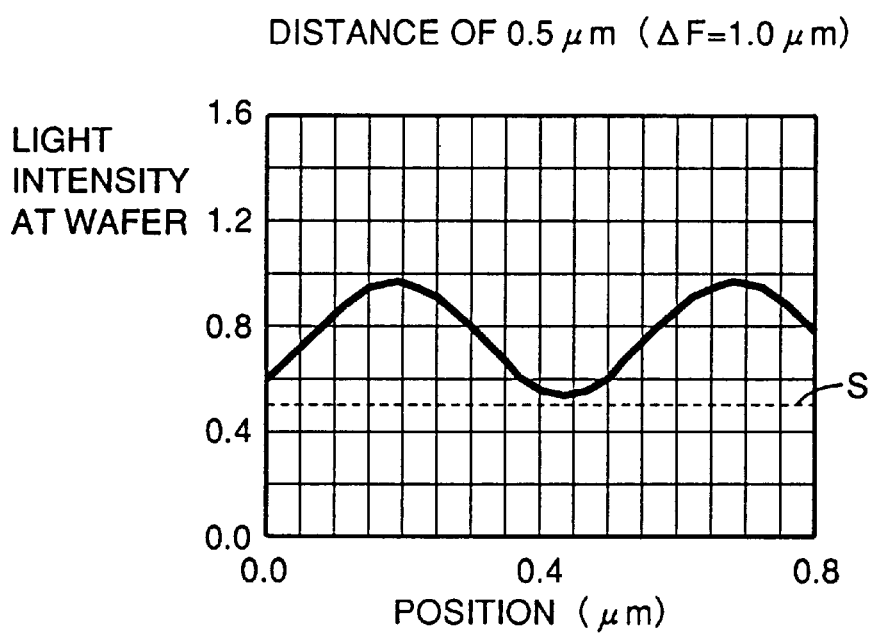
FIG. 36 is a fourth diagram showing an intensity of exposure light in the case where a phase shift mask having no light sielding film is used.

Referring to FIGS. 6 and 7, a sufficiently high contrast was obtained in both optical images with focus offsets ΔF of 0 μm and 1.0 μm. In particular, the optical image shown in FIG. 7 had a contrast sufficiently higher than that of the optical image of the conventional example shown in FIG. 36, and sufficiently dark lines were able to be formed.

It was found from the result of the simulation that, with the patten forming method according to the present embodiment, the depth of focus larger than that of the conventional example can be ensured and small patterns can be formed in the case of dense patterns even with exposure light being slightly defocused. The reason for that is described in the following.

Figure 8:
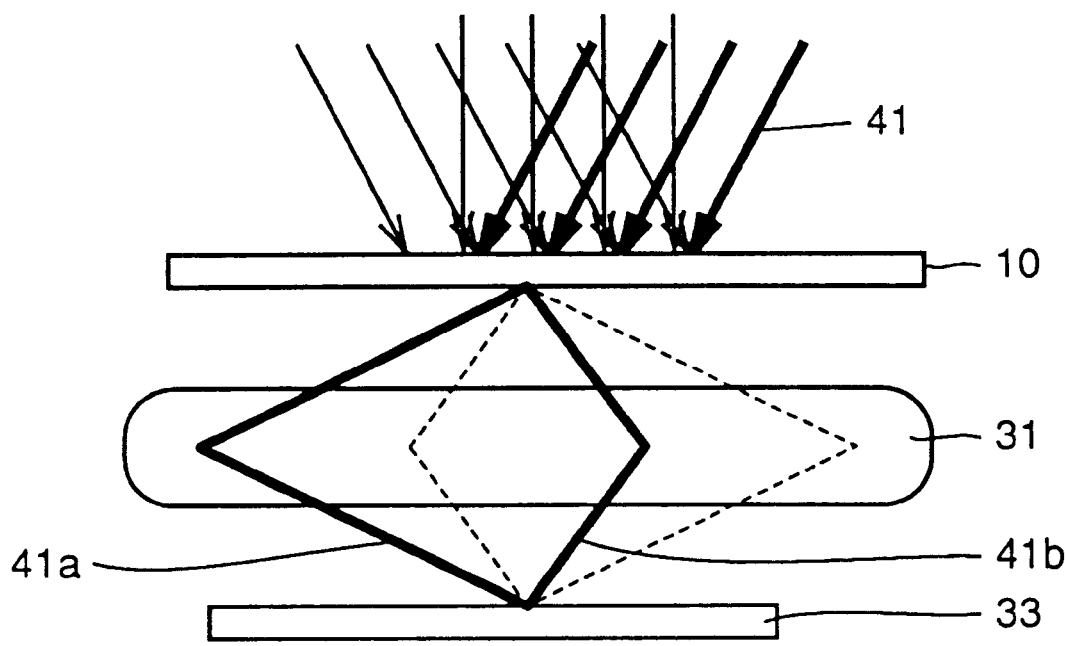
FIG. 8 is a diagram showing how an image is formed when light spreading with respect to the incident direction is used.
Figure 27:
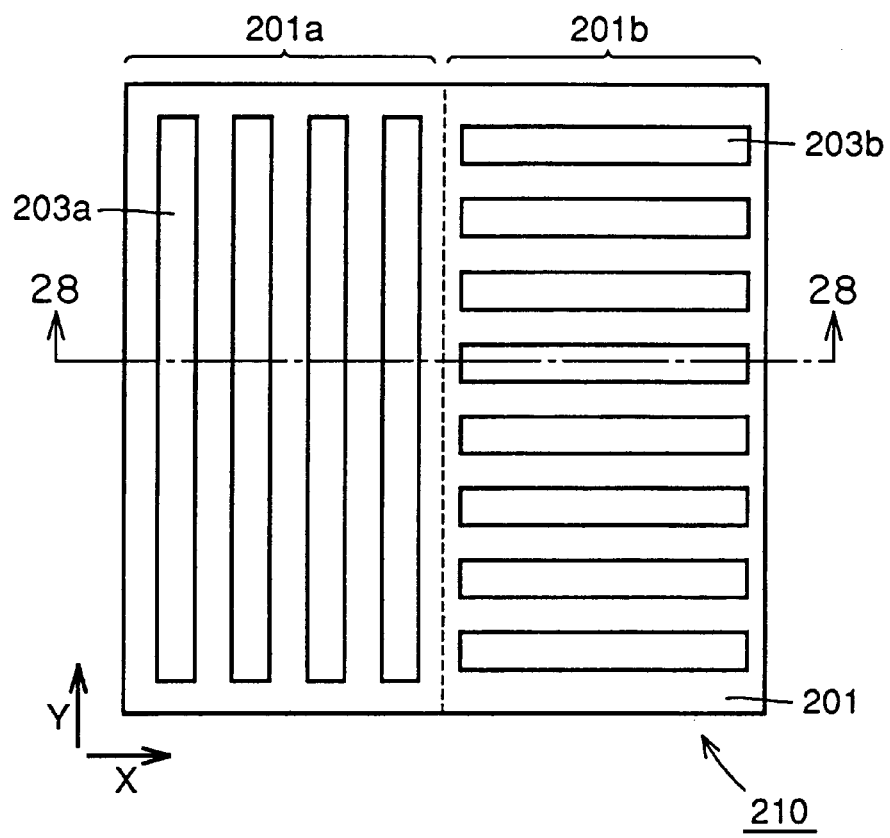
FIG. 27 is a plan view schematically showing a structure of a phase shift mask for use in a conventional pattern forming method.
Figure 28:
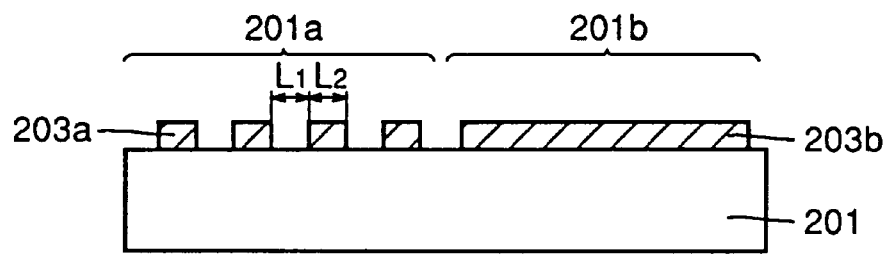
FIG. 28 is a schematic cross sectional view taken along the line G–G' of FIG. 27.
Figure 29:
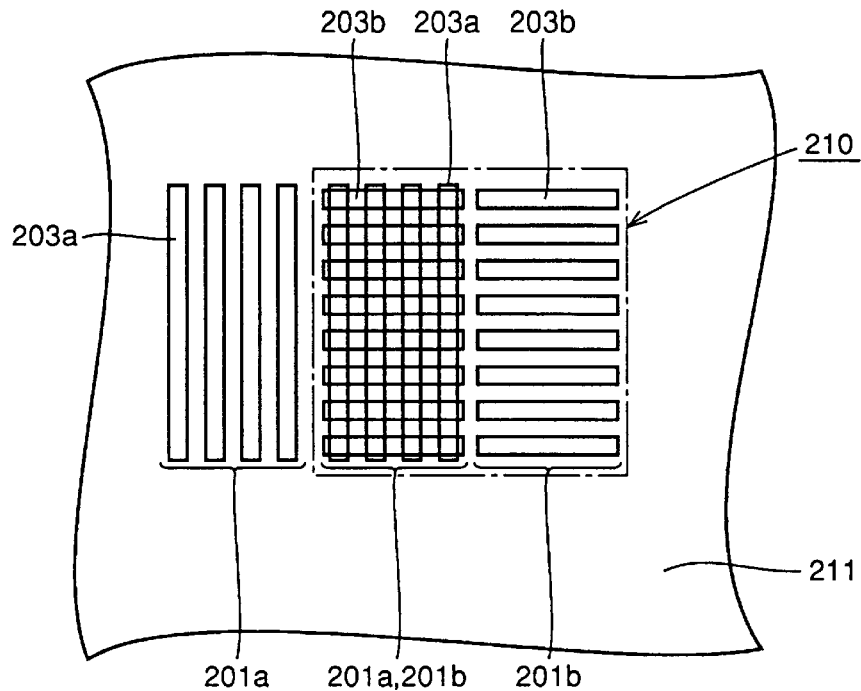
FIG. 29 is a schematic plan view used in illustration of the conventional pattern forming method.
Figure 30:
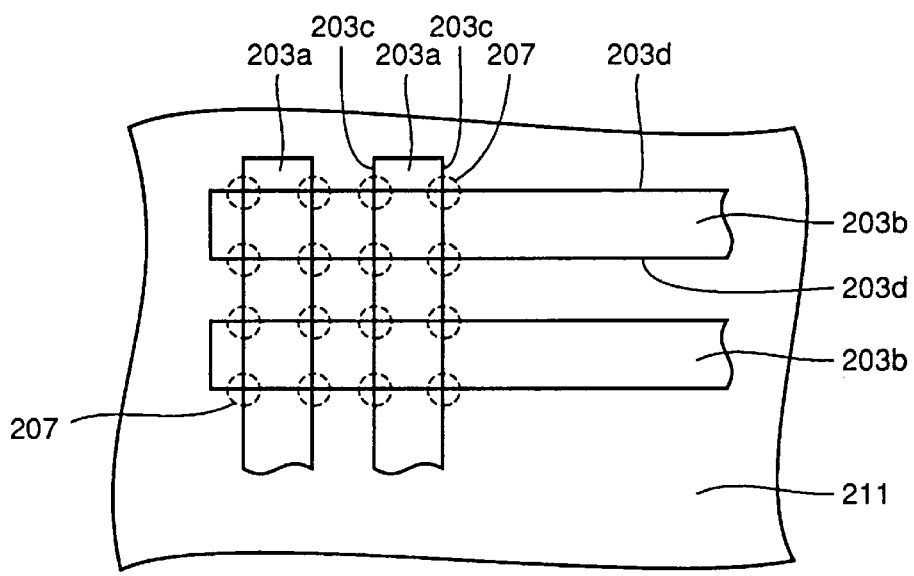
FIG. 30 is a schematic plan view showing in enlargement a region in FIG. 29 where patterns intersect each other.
Figure 31:
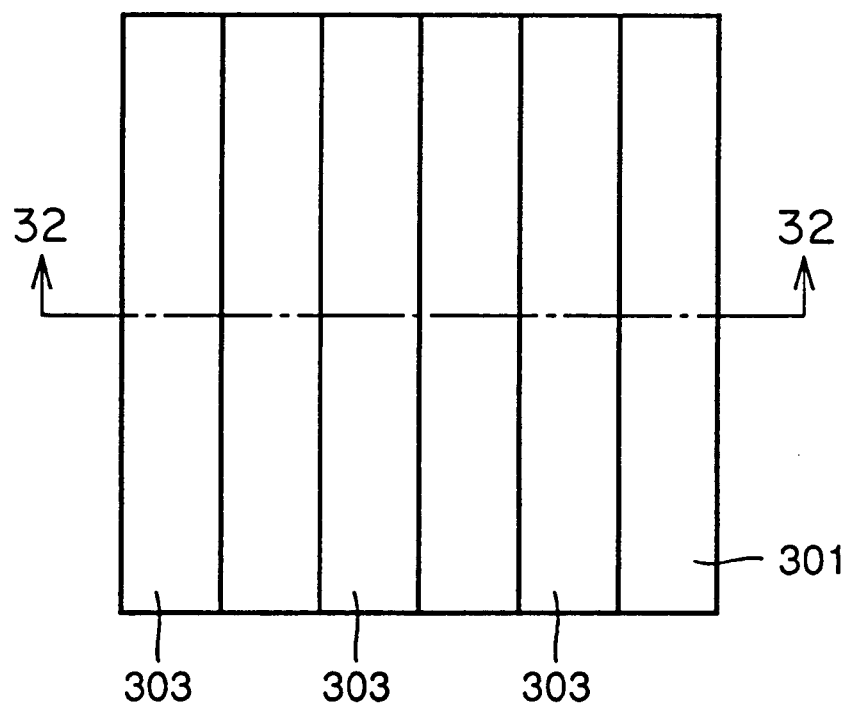
FIG. 31 is a plan view schematically showing a structure of a phase shift mask used for simulation.
Figure 32:
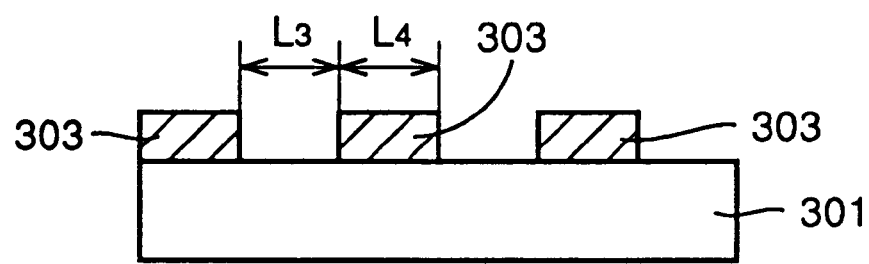
FIG. 32 is a schematic cross sectional view taken along the line H–H' of FIG. 31.
Figure 33:
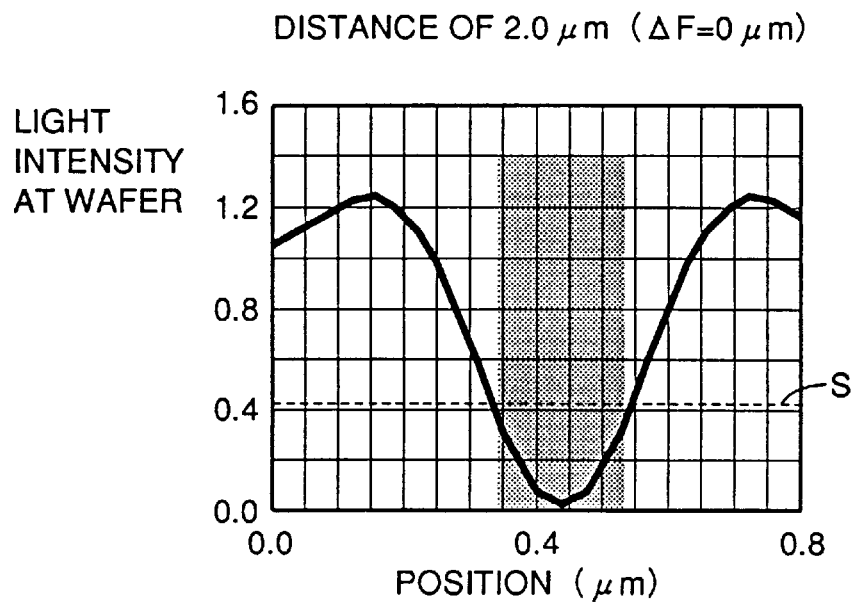
FIG. 33 is a first diagram showing an intensity of exposure light in the case where a phase shift mask having no light shielding film is used.
Figure 34:
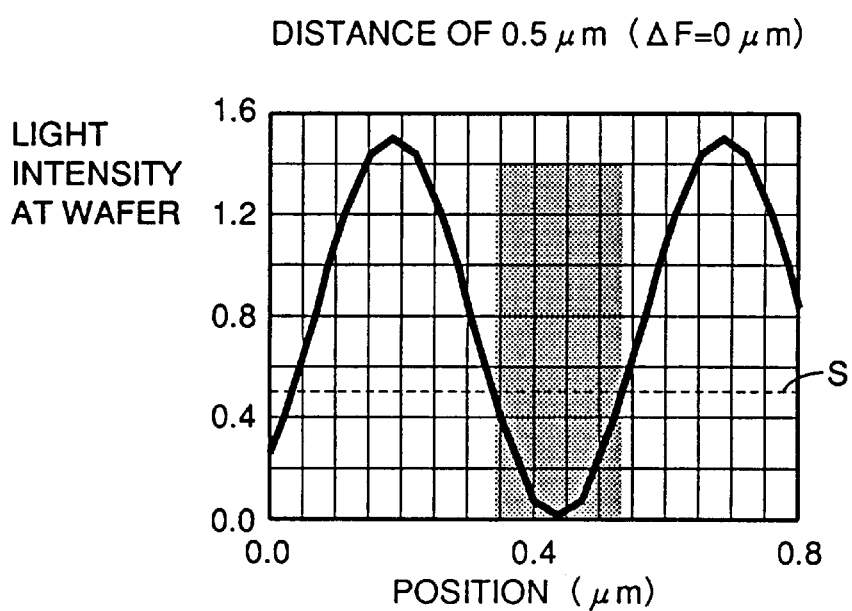
FIG. 34 is a second diagram showing an intensity of exposure light in the case where a phase shift mask having no light sielding film is used.
Figure 35:
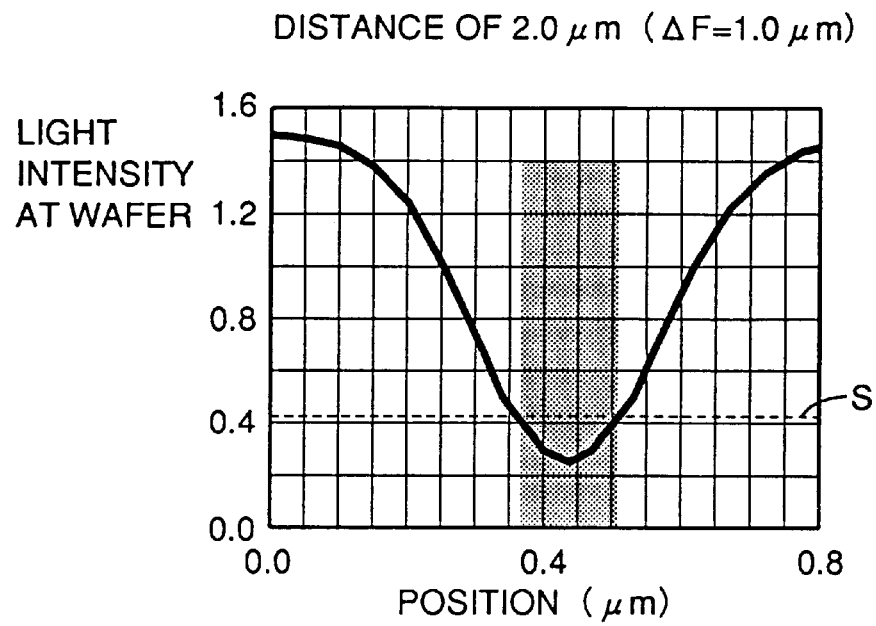
FIG. 35 is a third diagram showing an intensity of exposure light in the case where a phase shift mask having no light sielding film is used.

When a phase shift mask of Levenson type is used, the mask is usually irradiated with parallel light (or light close to parallel light). On the other hand, the phase shift mask having no light shielding film shown in FIGS. 27 and 28 is irradiated with parallel light, stability of resist size cannot be maintained. Therefore, the phase shift mask having no light shielding film is irradiated with light 41 spreading with respect to the incident direction, as shown in FIG. 8.

After light 41 passes through a mask 10, an image is formed on a wafer 33 by a lens 31. There are a lot of image formation (components) by oblique incident light (components) in light 41 spreading with respect to the incident direction. Therefore, in image formation with oblique incident light, an image is formed by interference of two pencils of rays 41a and 41b having asymmetric incident angles with respect to a line perpendicular to a focal plane.

Figure 9:
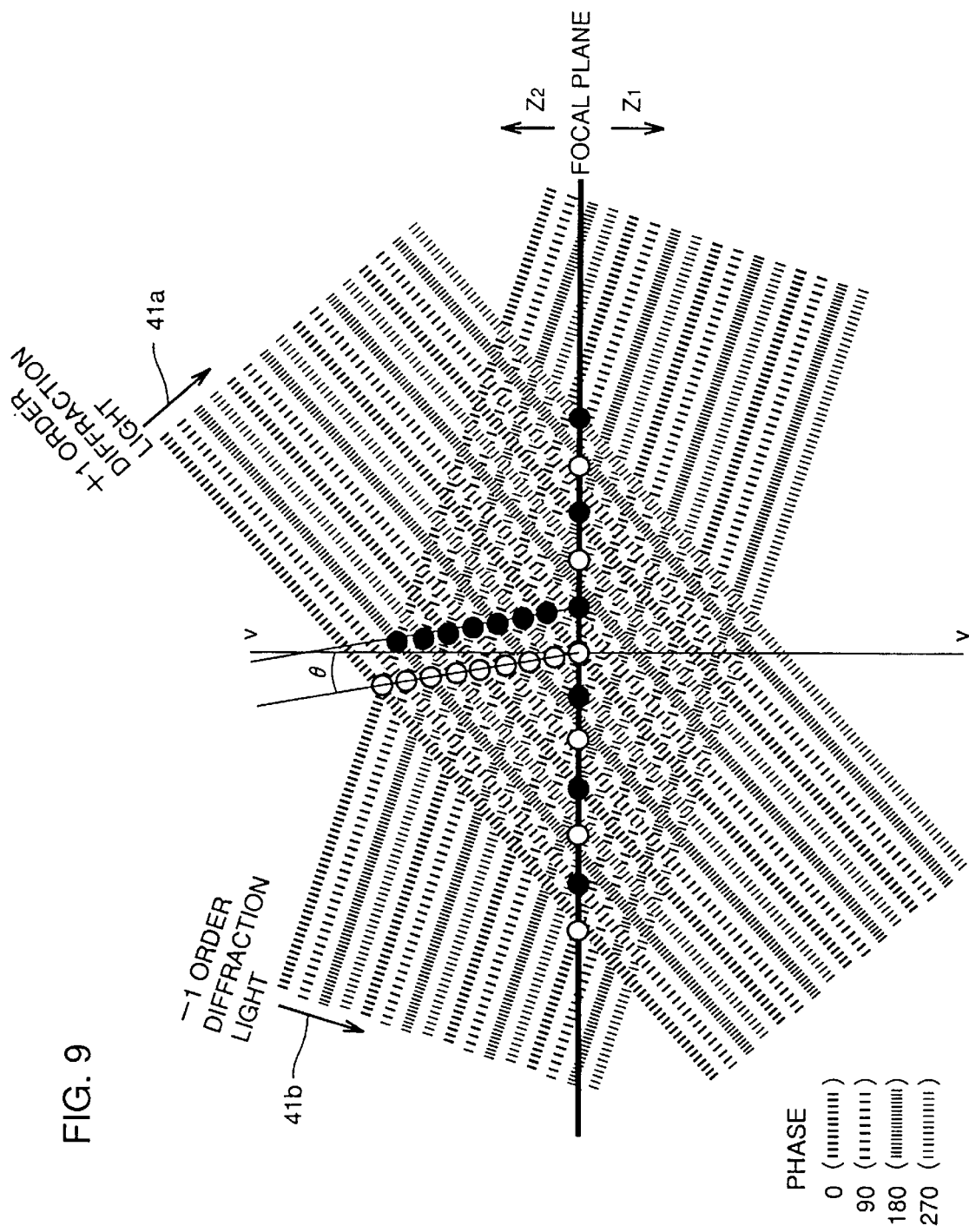
FIG. 9 is a diagram showing how an image is formed with interference of two pencils of rays having asymmetric incident angles with respect to a line perpendicular to a focal plane.

At this time, interference of two pencils of rays (for example, positive first order diffraction light and negative first order diffraction light) 41a and 41b results in bright and dark portions in light, consisting of bright points ○ and dark points ● as shown in FIG. 9. However, since two kinds of luminous flux 41a and 41b have asymmetric incident angles with respect to the line perpendicular to the focal plane, a bright line (a plurality of bright points ○ being in line) and a dark line (a plurality of dark points ● being in line) are inclined at a prescribed angle θ with respect to the line (the line v—v) perpendicular to the focal plane.

Therefore, as an image plane is shifted away from the focal plane (i.e. is brought out of focus) in the direction of an arrow $Z_1$ or $Z_2$, an image is formed such that the position of bright and dark portions within the image plane is shifted without change in contrast.

Figure 10:
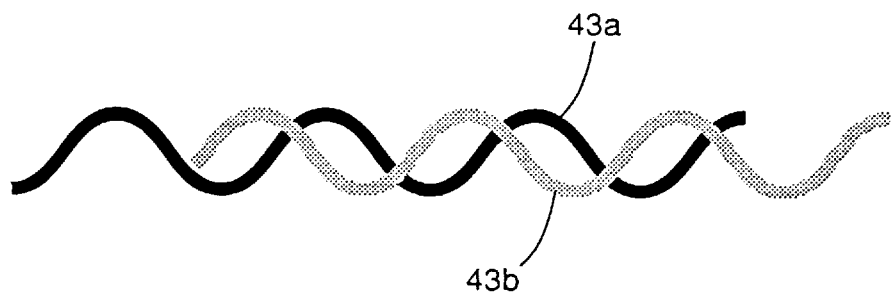
FIG. 10 is a diagram showing two interference fringes being shifted from each other.
Figure 11:
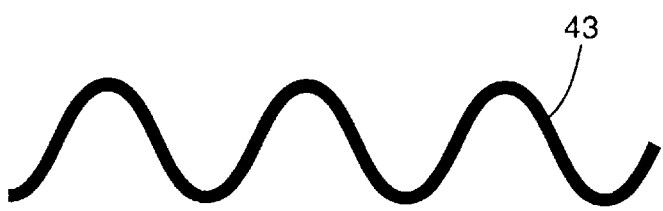
FIG. 11 is a diagram showing two interference fringes overlapping with each other.

In actual image formation, there is illumination (shown by a dotted line) symmetrical with respect to illumination (shown by a solid line) having two pencils of rays 41a and 41b, as shown in FIG. 8. Accordingly, if the image plane is shifted in the direction of arrow $Z_1$ or $Z_2$ as described above, an image obtained by the illumination (shown by the dotted line) is moved to the side opposite to that of the image obtained by the above mentioned illumination (shown by the solid line). Therefore, interference fringes 43a and 43b respectively resulting from the illumination (shown by the solid line) and the illumination (shown by the dotted line) are shifted from each other as shown in FIG. 10. Accordingly, a contrast of an image resulting from these interference fringes 43a and 43b is smaller than that of an image resulting from two interference fringes 43a and 43b overlapping with each other (shown by 43) as shown in FIG. 11, that is, smaller than that of an image obtained by parallel light.

From the foregoing, it can be considered that with a phase shift mask having no light shielding film, the depth of focus is small and small patterns cannot be formed in the case of dense patterns with exposure light being even slightly defocused.

Figure 12:
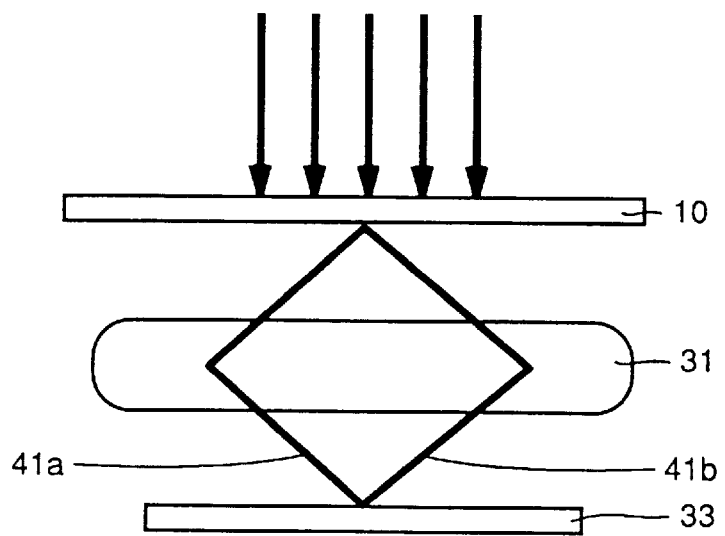
FIG. 12 is a diagram showing how an image is formed with parallel light.
Figure 13:
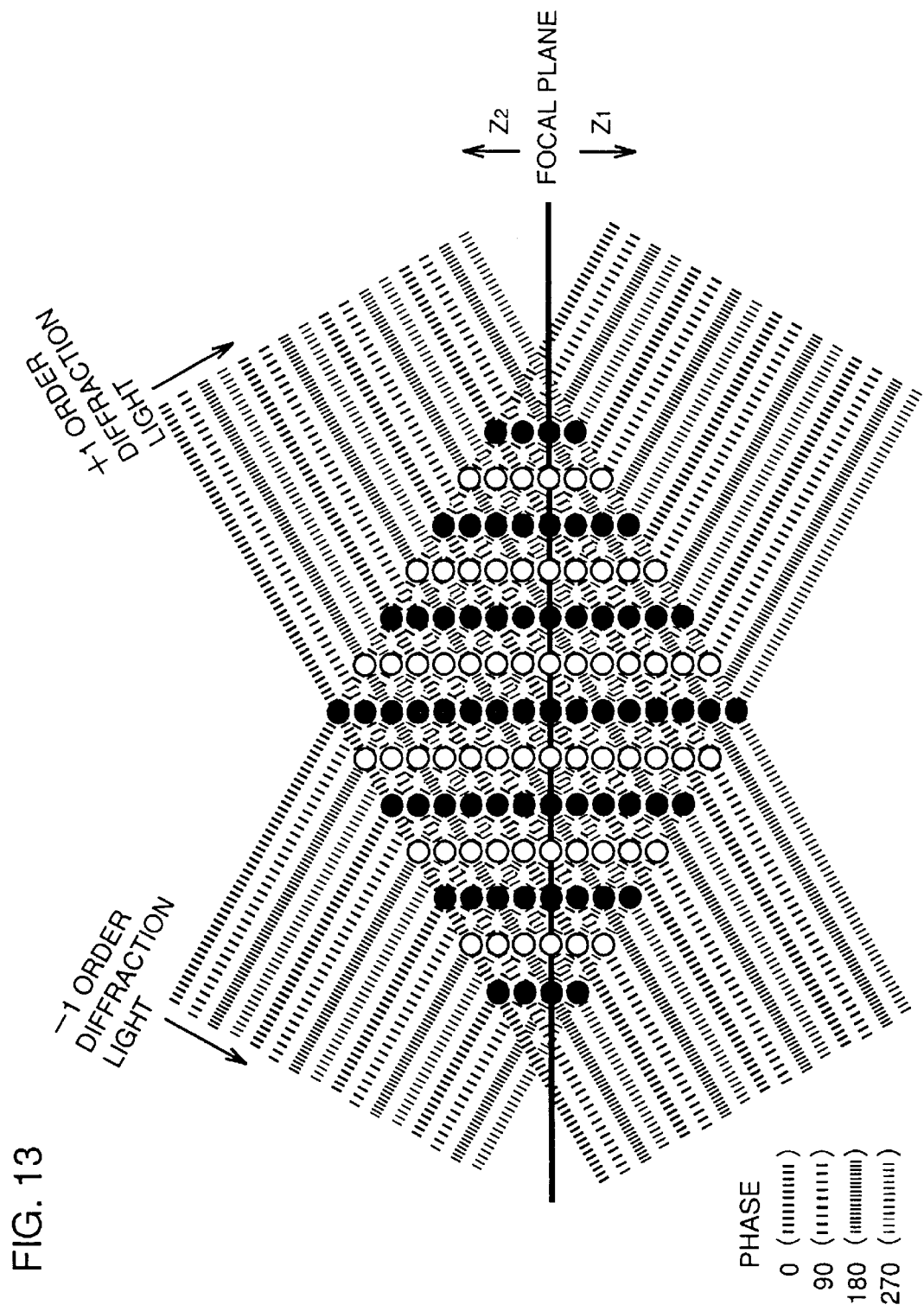
FIG. 13 is a diagram showing how an image is formed with interference of two pencils of rays having symmetric incident angles with respect to a line perpendicular to a focal plane.

On the other hand, the phase shift mask of Levenson type of the present embodiment shown in FIGS. 1 to 3 is irradiated with parallel light as described above. Therefore, an image is formed by interference of two pencils of rays 41a and 41b having symmetrical incident angles with respect to a line perpendicular to the focal plane as shown in FIG. 12. At this time, as shown in FIG. 13, a bright line and a dark line in light are approximately perpendicular to the focal plane. Therefore, an image formed will not change even if the image plane is shifted away from the focal plane in the direction of an arrow $Z_1$ or $Z_2$.

Accordingly, it can be considered that, in the pattern forming method according to the present embodiment, small patterns can be formed in the case of dense patterns even with exposure light being slightly defocused.

Furthermore, we actually formed hole patterns in a negative resist in a manner described in (i) to (iii) in the following using the method of the present embodiment.

(i) A negative resist was subjected to first exposure using first phase shift mask 10A in FIG. 1 having line widths Wn, Ws and Wa of 0.24 µm each.

Thereafter, a region of the resist, which had been subjected to first exposure, was subjected to second exposure using second phase shift mask 10B of FIG. 2 having line widths Wn, Ws and Wa of 0.24 µm each. The second exposure was carried out with straight patterns of second phase shift mask 10B being located approximately perpendicular to patterns of first phase shift mask 10A.

The first exposure and the second exposure were carried out with numerical aperture NA of 0.55, coherency factor σ of 0.15, and exposure energy of 45 mJ/cm$^2$. In addition, a PEX-212 chemical amplification type negative resist with a thickness of 0.735 µm made by Sumitomo Chemical Co., Ltd. was used.

This double exposure was carried out with each of the focus offsets ΔF of −1.2 µm, −0.8 µm, 0 µm, +0.8 µm, and +1.2 µm.

Thereafter, dark portions of the resist were dissolved and removed by ordinary development to form hole patterns.

Consequently, the result as shown in the SEM photographs of FIGS. 14 to 18 was obtained. FIGS. 14 to 18 show opening shapes of hole patterns formed with focus offsets of −1.2 µm, −0.8 µm, 0 µm (in focus), +0.8 µm, and +1.2 µm, respectively.

Figure 15:
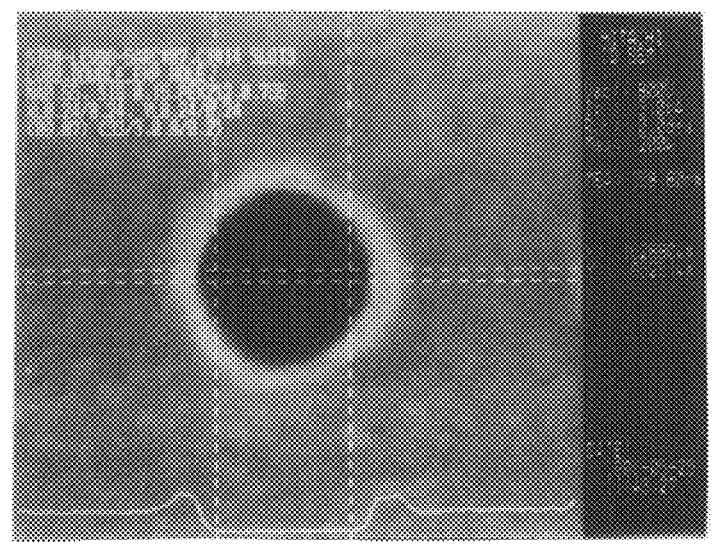
FIG. 15 is a second SEM photograph showing a small hole pattern formed by the pattern forming method using a phase shift mask according to the first embodiment of the present invention.
Figure 16:
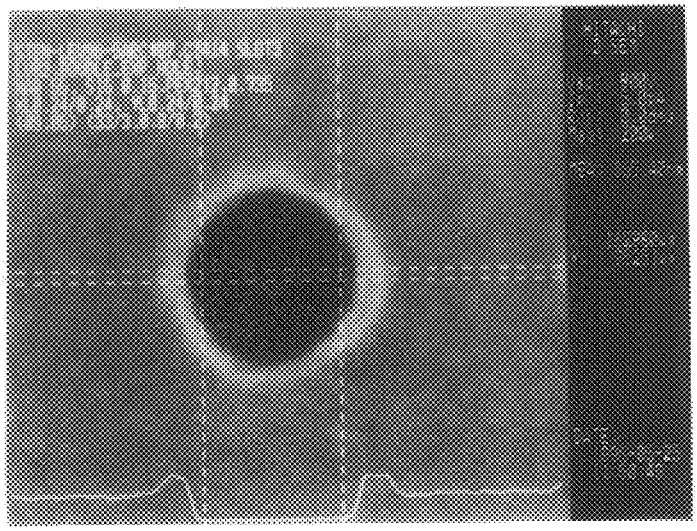
FIG. 16 is a third SEM photograph showing a small hole pattern formed by the pattern forming method using a phase shift mask according to the first embodiment of the present invention.
Figure 17:
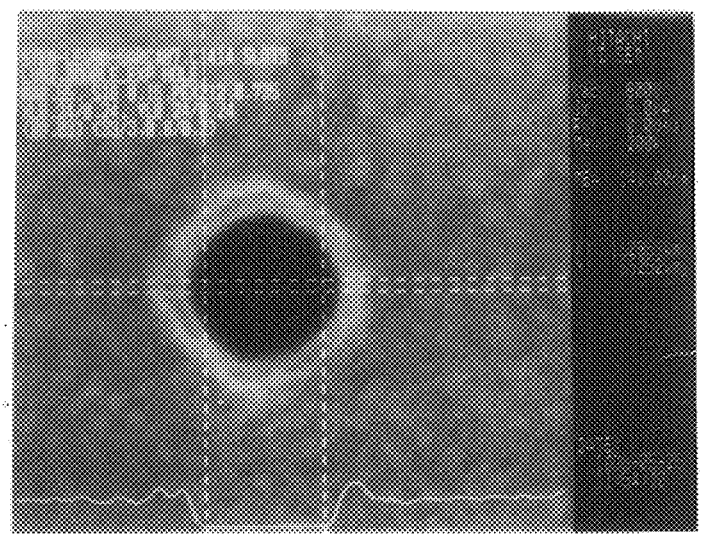
FIG. 17 is a fourth SEM photograph showing a small hole pattern formed by the pattern forming method using a phase shift mask according to the first embodiment of the present invention.

It can be seen from FIGS. 15 to 17 that normal hole patterns are formed with a focus offset ΔF in the range from −0.8 µm to +0.8 µm. Thus, it was appreciated that a focus margin is sufficiently large at least 1.6 µm in the pattern forming method of the present embodiment.

Figure 14:
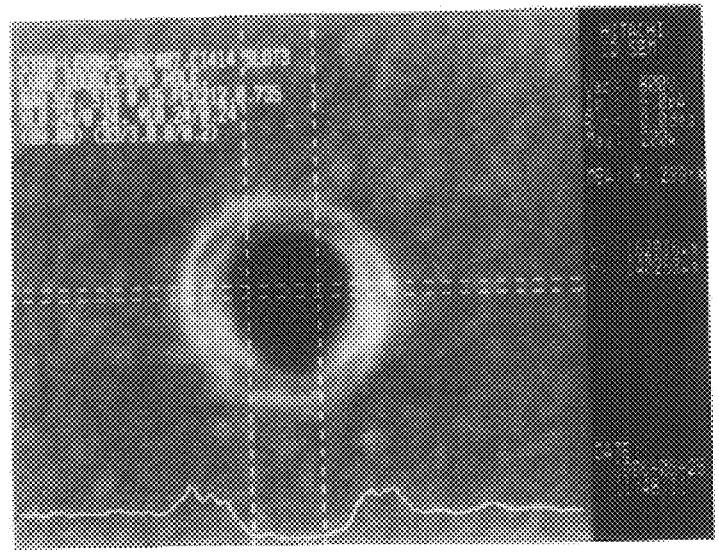
FIG. 14 is a first SEM (Scanning Electron Microscope) photograph showing a small hole pattern formed by the pattern forming method using a phase shift mask according to the first embodiment of the present invention.
Figure 18:
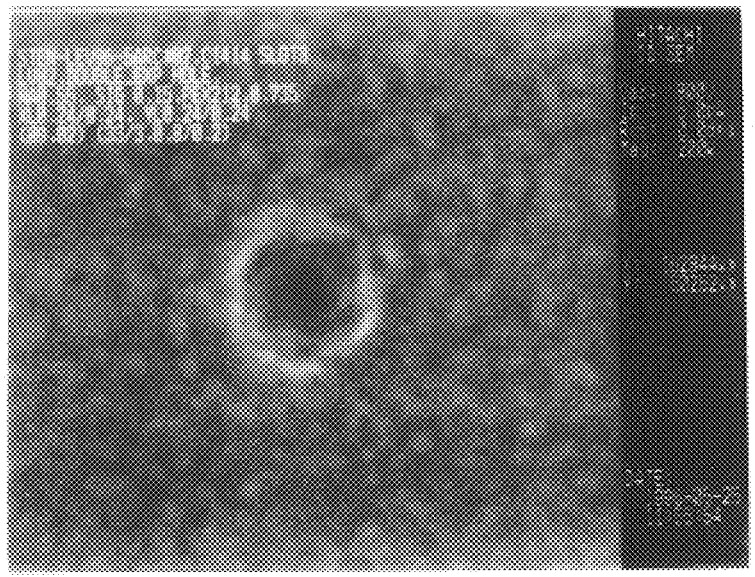
FIG. 18 is a fifth SEM photograph showing a small hole pattern formed by the pattern forming method using a phase shift mask according to the first embodiment of the present invention.

Note that an opening of the hole pattern was not formed completely with the focus offsets of −1.2 µm and +1.2 µm as shown in FIGS. 14 and 18, respectively. Thus, it was also appreciated that a focus margin is less than 2.4 µm.

Figure 19:
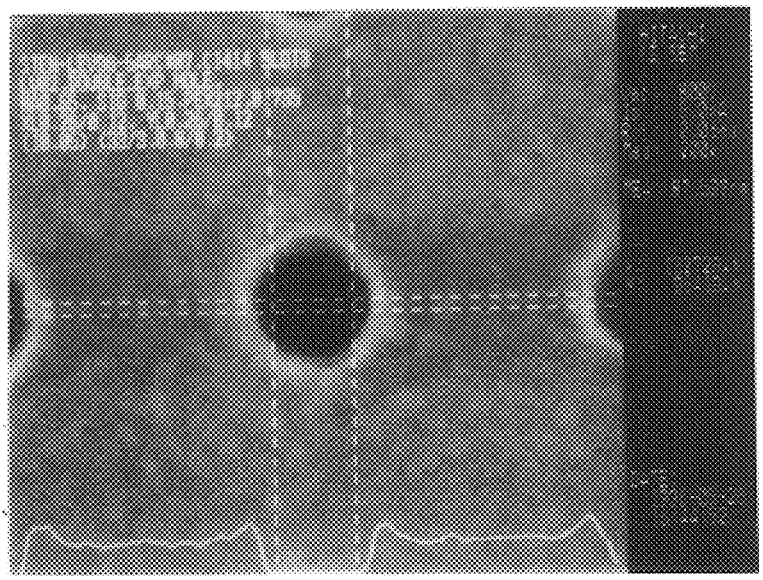
FIG. 19 is a sixth SEM photograph showing a small hole pattern formed by the pattern forming method using a phase shift mask according to the first embodiment of the present invention.

(ii) Hole patterns were formed by double exposure using first and second phase shift masks 10A and 10B of FIGS. 1 and 2 both having line widths Wn and Wa of 0.26 µm each and line width Ws of 0.12 µm. Each exposure of the double exposure was carried out with exposure energy of 48 mJ/cm$^2$ and with exposure light being focused. Note that other conditions were the same as those in (i) described above. An SEM photograph of FIG. 19 shows an opening shape of a thus formed hole pattern. Referring to FIG. 19, an opening of the hole pattern was completely formed and an opening diameter thereof was about 0.09 µm as can be seen from a measurement value in the photograph.

Accordingly, it was appreciated that hole patterns having a small opening diameter of at least 0.09 µm can be formed by the pattern forming method of the present embodiment. Furthermore, it can be considered that hole patterns having an even smaller opening diameter could be formed depending on setting of the conditions.

Figure 20:
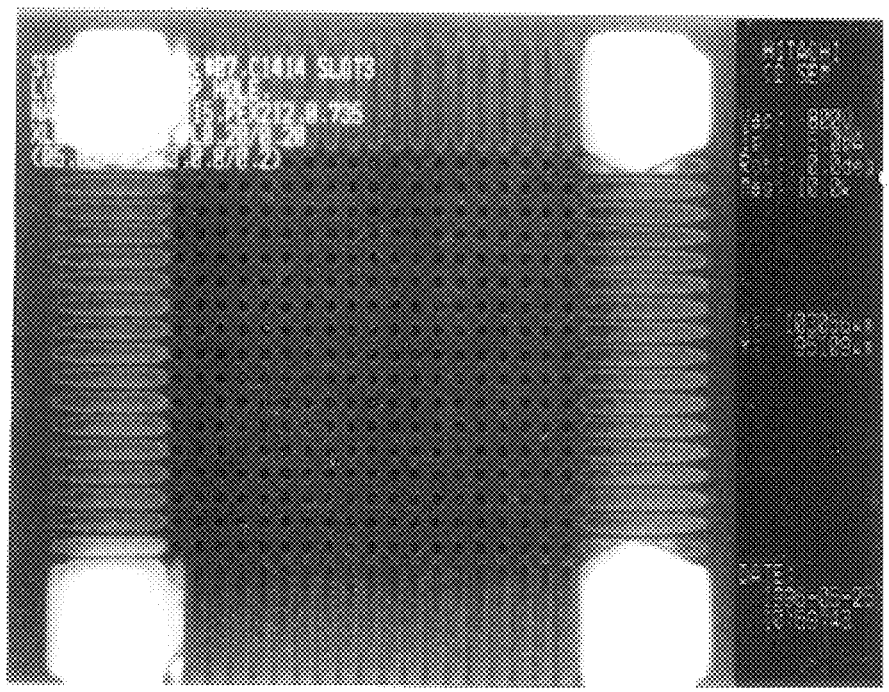
FIG. 20 is a seventh SEM photograph showing dense hole patterns formed by the pattern forming method using a phase shift mask according to the first embodiment of the present invention.

(iii) Dense hole patterns were formed by double exposure using first and second phase shift masks 10A and 10B of FIGS. 1 and 2 both having line widths Wn, Ws and Wa of 0.20 µm each. Each exposure of the double exposure was carried out with exposure energy of 33 mJ/cm$^2$ and with exposure light being focused. Note that other conditions were the same as those in (i) described above. An SEM photograph of FIG. 20 shows a state of thus formed dense hole patterns. It can be seen from FIG. 20 that the hole patterns are formed with a pitch of 0.4 µm. In addition, an opening diameter of each hole pattern was 0.15 µm.

Thus, it was found that dense hole patterns can be formed with a small pitch of at least 0.4 µm by the pattern forming method of the present embodiment. Furthermore, it can be considered that dense hole patterns could be formed with an even smaller pitch, depending on setting of the conditions.

The change in depth of focus DOF with the change in opening diameter of a hole pattern formed by the pattern forming method of the present embodiment was also examined. The result thereof is shown in FIGS. 21 and 22.

Figure 21:
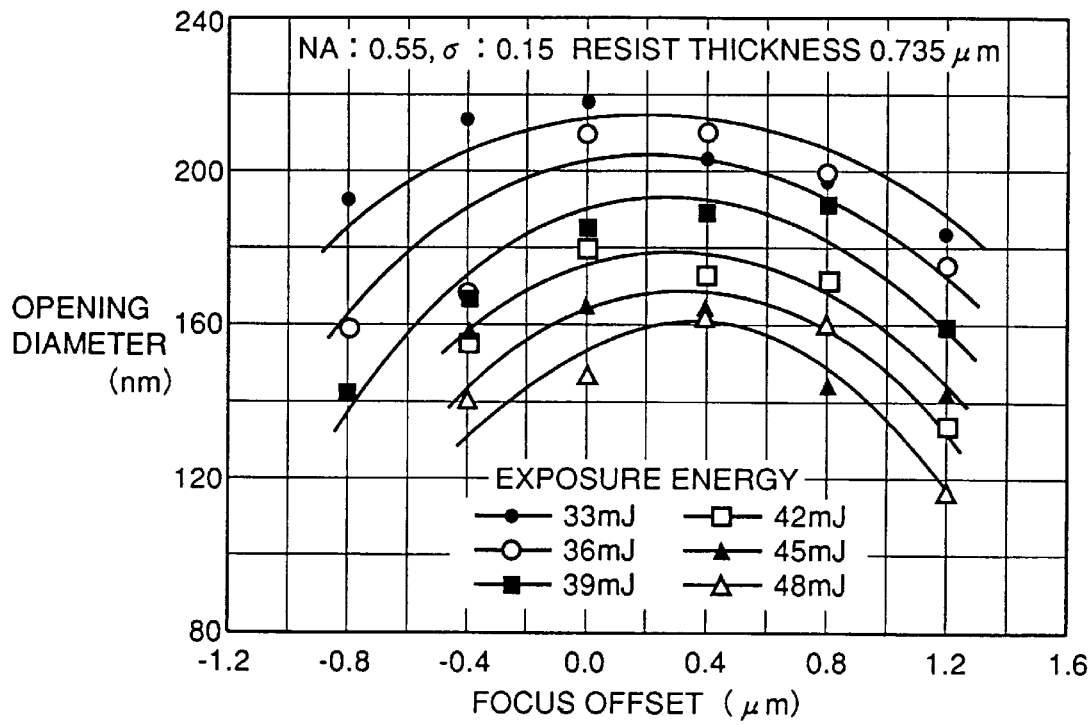
FIG. 21 is a first plot of the change in hole diameter with the change in focus offset.

FIG. 21 is a graph obtained in the case of double exposure using first and second phase shift masks 10A and 10B of FIGS. 1 and 2 having line widths Wn, Ws and Wa of 0.24 µm each. In addition, FIG. 22 is a graph obtained in the case of double exposure using first and second phase shift masks 10A and 10B of FIGS. 1 and 2 having line widths Wn and Wa of 0.26 µm each and line width Ws of 0.16 µm.

The depth of focus DOF is generally evaluated with a measurement value of a focus offset ΔF in the range of ±10% of an opening diameter of a hole pattern. More specifically, if an opening diameter of a hole pattern is 0.20 µm, for example, the depth of focus DOF is evaluated with a focus offset ΔF in the range from 0.18 to 0.22 µm. According to this, in the case of FIG. 21, it can be seen that the depth of focus DOF is up to 2.0 µm if an opening diameter of a hole is up to 0.20 µm (200 nm), and is up to 1.6 µm if the opening diameter is up to 0.16 µm (160 nm).

Figure 22:
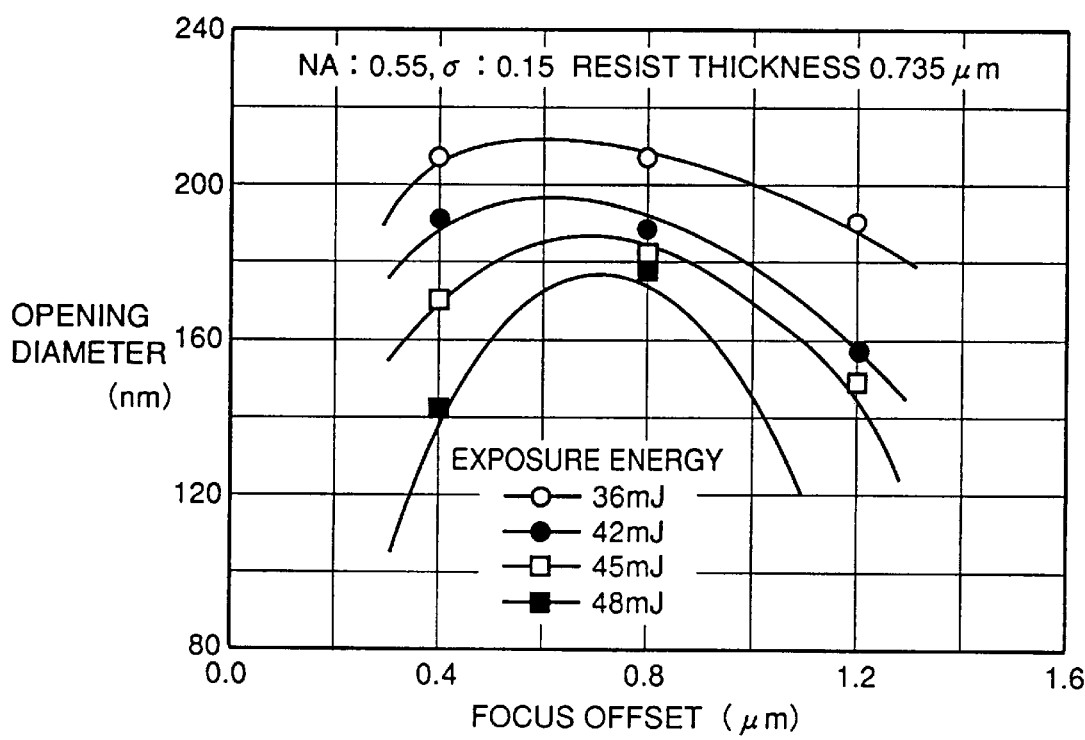
FIG. 22 is a second plot of the change in hole diameter with the change in focus offset.

Furthermore, in the case of FIG. 22, it can be seen that the depth of focus DOF is up to 1.0 µm if an opening diameter of a hole is up to 0.12 µm (120 nm), and is up to 0.8 µm if the opening diameter is up to 0.10 µm.

From the result of this experiment as well, it can be appreciated that, with the pattern forming method of the present embodiment, sufficiently large depth of focus DOF can be obtained for each opening diameter of a hole pattern.

As described above, each of first and second phase shift masks 10A and 10B for use in the double exposure of the present embodiment has light shielding film 3. Therefore, larger depth of focus can be realized as compared with that of the conventional example, so that small hole patterns can be formed even with exposure light being slightly defocused in the case of dense patterns.

In the above described double exposure, coherency σ of exposure light is preferably in the range from 0.1 to 0.3. The reason for this is described in the following.

Coherency σ represents a degree of optical interference, and smaller coherency σ indicates higher degree of optical interference, and larger coherency σ indicates lower degree of optical interference. More specifically, exposure using a phase shift mask is a technique for improving resolution by interference of light having opposite phases, and therefore higher degree of optical interference is more preferable. Accordingly, when a phase shift mask is used, coherency σ is preferably equal to or smaller than 0.3. On the other hand, if the degree of optical interference is increased too much, a pattern having an undesired shape is likely to be produced in a region where the regularity of pattern arrangement is degraded. Therefore, coherency σ is preferably equal to or higher than 0.1.

Second Embodiment

Figure 23:
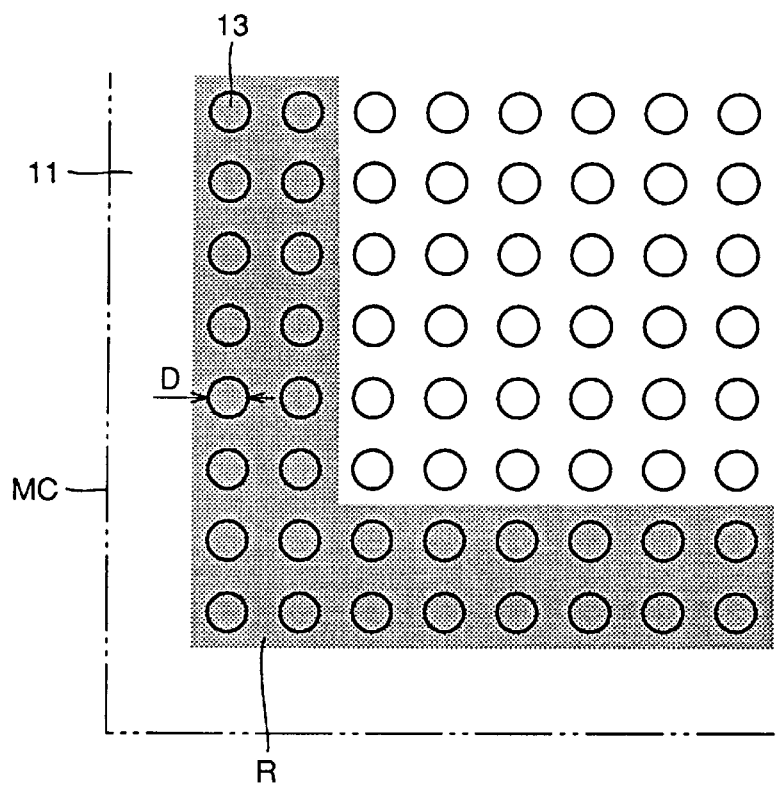
FIG. 23 is a schematic plan view used in illustration of a pattern forming method using a phase shift mask according to a second embodiment of the present invention.
Figure 24A:
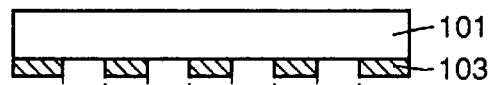
FIG. 24A is a cross sectional view of a conventional photomask.
Figure 24B:
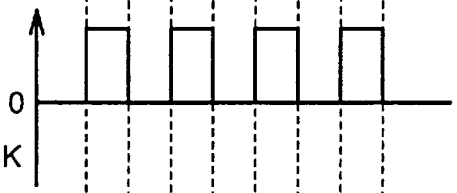
FIGS. 24B and 24C are diagrams respectively illustrating an electric field over the mask and a light intensity at a wafer.
Figure 24C:
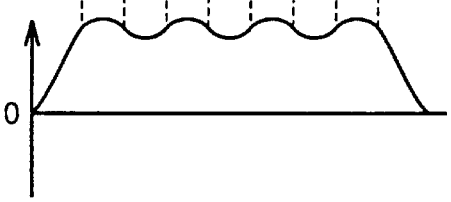
Figure 25A:
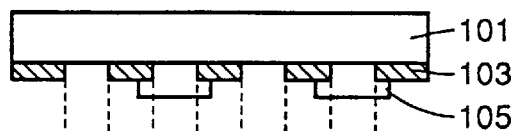
FIG. 25A is a cross sectional view of a photomask of Levenson type.
Figure 25B:
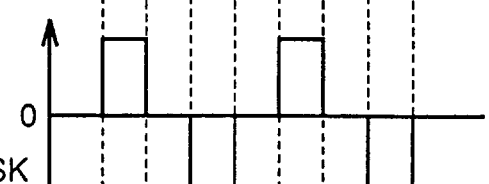
FIGS. 25B and 25C are diagrams respectively illustrating an electric field over the mask and a light intensity at a wafer.
Figure 25C:
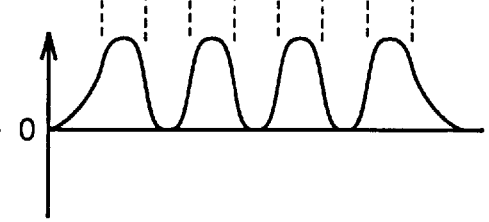
Figure 26A:
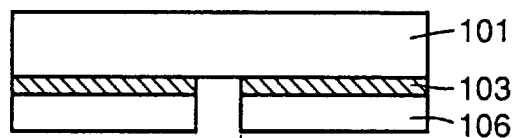
FIG. 26A is a cross sectional view of a photomask of halftone type.
Figure 26B:
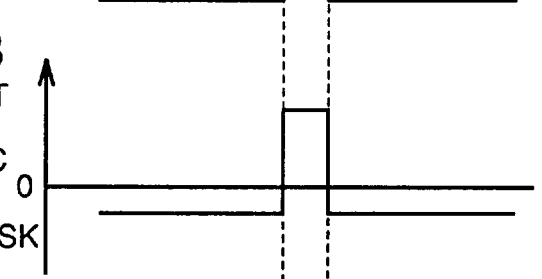
FIGS. 26B and 26C are diagrams respectively illustrating an electric field over the mask and a light intensity at a wafer.
Figure 26C:
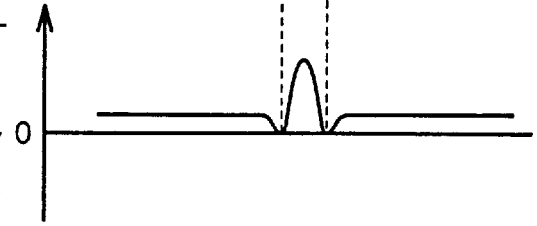

With the method of the first embodiment, dense hole patterns 13 can be arranged regularly in a resist on a memory cell array region MC of a DRAM, for example, as shown in a plan view of FIG. 23. In the outside of the memory cell array region MC, hole patterns are not always formed regularly such as those in the memory cell array region MC. Therefore, the regularity of pattern arrangement is degraded outside an outer periphery (shown by a chain two-dotted line) of the memory cell array region MC.

Exposure using a phase shift mask is a technique for improving resolution by interference of light having opposite phases as described above. Therefore, when patterns arranged regularly are to be formed, regular interference of exposure light occurs, so that patterns with a uniform shape can be formed. However, the regularity of interference of exposure light is also degraded in a region where the regularity of pattern arrangement is degraded, making it difficult to form patterns with a uniform shape. Therefore, in a region R (shown as a hatched region) in the vicinity of the portion where the regularity of pattern arrangement is degraded, respective opening diameters D of hole patterns 13 are not uniform, that is, each opening diameter D is larger or smaller than a prescribed size.

Thus, in the present embodiment, third exposure is further carried out after the double exposure described in the first embodiment in order to solve the above mentioned problems.

More specifically, only the region R of FIG. 23 is subjected to another exposure. Thus, the patterns in the region R can be removed, so that only patterns having a uniform shape can be left.

In the third exposure, exposure light needs to be directed only to the region R where formation of patterns with a uniform shape is difficult. Therefore, an edge of an image transferred onto a photoresisit needs to be sharp, and interference of exposure light must be reduced as well as exposure light having a high spacial frequency must be used. Accordingly, the third exposure is preferably carried out with numerical aperture NA of at least 0.50 and coherency a of exposure light of at least 0.60.

Although double exposure has been described in the first embodiment, multi-exposure more than double exposure may be used therein.

In addition, in FIG. 4A, the first and second phase shift masks are arranged such that a pattern of the first phase shift mask is approximately perpendicular to that of the second phase shift mask. However, the present invention is not limited to this, and respective patterns of the first and second phase shift masks may be arranged at any angle therebetween so long as the respective patterns of the first and second phase shift masks intersect each other.

In addition, although only approximately straight patterns are shown in FIGS. 1 and 2, the present invention may use either patterns consisting of combination of such approximately straight patterns or patterns partially including approximately straight patterns.

Note that exposure light may be any one of a g-line, an i-line, KrF light and ArF light.

In addition, a material of transparent substrate 1 is not limited to quartz, so long as the material has transmittance of at least 90%.

Furthermore, although light shielding film 3 made of chromium has been described, the present invention is not limited to this. More specifically, light shielding film 3 may be a multi-layer film such as CrO/Cr/CrO. The characteristics required for light shielding film 3 include non-transmission of exposure light, superior chemical-resistance property (taking a washing processing into consideration), and adhesion. Accordingly, a material which satisfies these characteristics could be used as light shielding film 3.

Furthermore, the present invention is not limited to the size and the material described in the first and second embodiments, and size and material can be selected arbitrarily.

Since double exposure is carried out such that respective patterns of the first and second phase shift masks intersect each other in the pattern forming method using a phase shift mask according to the present invention, hole patterns having a small opening diameter can be formed.

Furthermore, a light shielding film is located between the first and second light transmitting portions for respectively transmitting exposure light with a phase difference therebetween. Therefore, hole patterns having a small opening diameter can be formed in the case of dense patterns even if a resist is slightly out of focus.

According to one preferred aspect of the present invention, when coherency $\sigma$ is larger than 0.3, the degree of interference of light having opposite phases is reduced too much, so that the effect of a phase shift mask for improving resolution by interference of light having opposite phases cannot be obtained effectively. In addition, when coherency $\sigma$ is smaller than 0.1, the degree of interference is increased too much, so that a pattern having an undesired shape is likely to be produced in a region where the regularity of pattern arrangement is degraded. Therefore, the first exposure and the second exposure are preferably carried out with coherency $\sigma$ of exposure light in the range from 0.1 to 0.3.

According to another preferred aspect of the present invention, a periphery of a pattern-intersecting region, where the regularity of pattern arrangement is degraded, is subjected to the third exposure. Thus, patterns in the periphery can be removed, so that only patterns having a uniform shape can be left.

According to a further preferred aspect of the present invention, exposure light of the third exposure needs to be directed only to the periphery where formation of patterns having a uniform shape is difficult. Thus, an edge of an image transferred onto a photoresist needs to be sharp, and therefore interference of exposure light must be reduced as well as exposure light having a high spacial frequency must be used. Accordingly, the third exposure is preferably carried out with numerical aperture NA of at least 0.50 and coherency $\sigma$ of exposure light of at least 0.60.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pattern forming method in which a prescribed region of a photoresist applied on a wafer is subjected to first exposure using a first phase shift mask and thereafter to second exposure using a second phase shift mask, wherein
    said first phase shift mask includes a substrate having first and second light transmitting portions extending in parallel in a first direction for respectively transmitting exposure light with a phase difference therebetween, and a light shielding film located between said first and second light transmitting portions extending in parallel,
    said second phase shift mask includes a substrate having third and fourth light transmitting portions extending in parallel in a second direction for respectively transmitting exposure light with a phase difference therebetween, and a light shielding film located between said third and fourth light transmitting portions extending in parallel, said first exposure and said second exposure are carried out such that said first direction of said first phase shift mask for use in said first exposure intersects said second direction of said second phase shift mask for use in said second exposure, said photoresist is a negative resist, and a hole pattern is formed, by development of said photoresist, in a region irradiated with exposure light such that said light shielding film of said first phase shift mask and said light shielding film of said second phase shift mask intersect each other at a surface of said photoresist.

2. The pattern forming method using a phase shift mask as recited in claim 1, wherein exposure light for use in said first exposure and said second exposure is any one of a g-line, an i-line, KrF light and ArF light.

3. The pattern forming method using a phase shift mask as recited in claim 1, wherein coherency $\sigma$ of exposure light for use in said first exposure and said second exposure is in a range from 0.1 to 0.3.

4. The pattern forming method using a phase shift mask as recited in claim 1, further comprising the step of carrying out third exposure after said second exposure, in which a periphery of a region where said first direction and said second direction intersect each other in said prescribed region of said photoresist is irradiated with exposure light.

5. The pattern forming method using a phase shift mask as recited in claim 4, wherein numerical aperture NA for use in said third exposure is at least 0.50, and coherency $\sigma$ of exposure light for use in said third exposure is at least 0.60.

* * * * *

UNITED STATES PATENT AND TRADEMARK OFFICE
CERTIFICATE OF CORRECTION

PATENT NO. : 5,958,656
DATED : September 28, 1999
INVENTOR(S) : SHUJI NAKAO

It is certified that error appears in the above-indentified patent and that said Letters Patent is hereby corrected as shown below:

In Column 3, Line 35, change "G-G" to --28-28--.

In Column 4, Line 25, change "H-H" to --32-32--.

In Column 6, Line 44, change "A-A" to --3-3--.

In Column 6, Line 47, change "C-C and E-E" to --4B-4B--.

In Column 6, Line 49, change "D-D" to --4C-4C--.

In Column 7, Line 65, change "G-G" to --28-28--.

In Column 8, Line 6, change "H-H" to --32-32--.

In Column 8, Line 55, change "B-B" to --3-3--.

In Column 9, Line 36, change "C-C, D-D and E-E" to --4B-4B, 4C-4C and 4B-4B--.

In Column 9, Line 37, change "C-C, D-D and E-E" to --4B-4B, 4C-4C and 4B-4B--.

Signed and Sealed this

Thirteenth Day of March, 2001

Attest:

NICHOLAS P. GODICI

*Attesting Officer*  *Acting Director of the United States Patent and Trademark Office*